(12) United States Patent
Li et al.

(10) Patent No.: US 10,144,824 B2
(45) Date of Patent: Dec. 4, 2018

(54) HALOGEN FREE RESIN COMPOSITION AND PREPREG AND LAMINATED BOARD PREPARED THEREFROM

(71) Applicant: SHENGYI TECHNOLOGY CO., LTD., Dongguan (CN)

(72) Inventors: Hui Li, Dongguan (CN); Kehong Fang, Dongguan (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 79 days.

(21) Appl. No.: 15/313,669

(22) PCT Filed: Dec. 2, 2014

(86) PCT No.: PCT/CN2014/092841
§ 371 (c)(1),
(2) Date: Nov. 23, 2016

(87) PCT Pub. No.: WO2016/074290
PCT Pub. Date: May 19, 2016

(65) Prior Publication Data
US 2017/0198135 A1    Jul. 13, 2017

(30) Foreign Application Priority Data

Nov. 11, 2014   (CN) .......................... 2014 1 0631941

(51) Int. Cl.
| | | |
|---|---|---|
| C08L 63/00 | (2006.01) | |
| C08G 59/00 | (2006.01) | |
| C08L 63/08 | (2006.01) | |
| C08L 71/12 | (2006.01) | |
| C08G 59/58 | (2006.01) | |
| C08J 5/04 | (2006.01) | |
| C08J 5/24 | (2006.01) | |
| H05K 1/03 | (2006.01) | |
| C08G 59/42 | (2006.01) | |
| C08K 3/36 | (2006.01) | |
| C08K 5/00 | (2006.01) | |
| C08K 5/3445 | (2006.01) | |
| C08K 5/49 | (2006.01) | |
| C08L 35/06 | (2006.01) | |
| C08L 63/04 | (2006.01) | |
| B32B 15/092 | (2006.01) | |

(52) U.S. Cl.
CPC .............. *C08L 63/08* (2013.01); *C08G 59/42* (2013.01); *C08G 59/58* (2013.01); *C08J 5/043* (2013.01); *C08J 5/24* (2013.01); *C08K 3/36* (2013.01); *C08K 5/0066* (2013.01); *C08K 5/3445* (2013.01); *C08K 5/49* (2013.01); *C08L 35/06* (2013.01); *C08L 63/00* (2013.01); *C08L 63/04* (2013.01); *C08L 71/12* (2013.01); *H05K 1/0373* (2013.01); *B32B 15/092* (2013.01); *C08J 2363/02* (2013.01); *C08J 2363/08* (2013.01); *C08J 2425/02* (2013.01); *C08J 2435/00* (2013.01); *C08J 2471/12* (2013.01); *C08L 2201/02* (2013.01); *C08L 2201/22* (2013.01); *C08L 2203/20* (2013.01); *C08L 2205/02* (2013.01); *C08L 2205/03* (2013.01); *C08L 2205/05* (2013.01); *C08L 2312/00* (2013.01); *H05K 2201/012* (2013.01)

(58) Field of Classification Search
CPC ......... C08L 63/00; C08L 71/12; C08G 59/40; C08F 26/00; C08K 51/0066
See application file for complete search history.

(56) References Cited

U.S. PATENT DOCUMENTS

| | | | | |
|---|---|---|---|---|
| 4,668,750 | A * | 5/1987 | Younes ................ | C08F 212/14 524/502 |
| 7,388,451 | B2 * | 6/2008 | Brunone ................ | H01L 23/66 333/247 |
| 2013/0075138 | A1 | 3/2013 | Yu et al. | |
| 2013/0115472 | A1 | 5/2013 | Yu et al. | |
| 2013/0161080 | A1 | 6/2013 | Lin | |

FOREIGN PATENT DOCUMENTS

| | | |
|---|---|---|
| CA | 1094706 A | 1/1981 |
| CN | 102119184 A | 7/2011 |
| CN | 102633952 A | 8/2012 |
| CN | 102964775 A | 3/2013 |
| CN | 103421273 A | 12/2013 |
| CN | 103842433 A | 6/2014 |
| CN | 103881059 A | 6/2014 |
| KR | 20060041603 A | 5/2006 |
| KR | 20140067005 A | 6/2014 |
| TW | 201100488 A | 1/2011 |

OTHER PUBLICATIONS

ISA / CN, International Search Report and Written Opinion, prepared for PCT/CN2014/092841, dated Aug. 14, 2015.

* cited by examiner

*Primary Examiner* — Mark Kopec
(74) *Attorney, Agent, or Firm* — McDonald Hopkins LLC

(57) ABSTRACT

The present invention relates to a halogen-free resin composition and a prepreg and a laminated board prepared therefrom. The halogen-free resin composition contains the following components in parts by weight: 50-100 parts of an epoxy resin; 20-70 parts of benzoxazine; 5-40 parts of a polyphenyl ether; 5-40 parts of allyl benzene-maleic anhydride; 10-60 parts of a halogen-free flame retardant; 0.2-5 parts of a curing accelerator, and 20-100 parts of a filler. The prepreg and laminated board prepared from the halogen-free resin composition have comprehensive performances such as a low dielectric constant, a low dielectric loss, an excellent flame retardance, heat resistance, cohesiveness and moisture resistance, etc., and are suitable for use in a halogen-free high multilayer circuit board.

19 Claims, No Drawings

HALOGEN FREE RESIN COMPOSITION AND PREPREG AND LAMINATED BOARD PREPARED THEREFROM

CROSS-REFERENCE TO RELATED APPLICATION

This application is a 35 U.S.C. 371 national stage filing of PCT Application No. PCT/CN2014/092841, filed on Dec. 2, 2014, which claims priority to Chinese Patent Application No. 201410631941.5, filed on Nov. 11, 2014, both of which are incorporated herein in their entirety by reference.

TECHNICAL FIELD

The present invention relates to the technical field of laminates, specifically to a resin composition, and especially relates to a halogen-free resin composition, a prepreg, a laminate, and a printed circuit board prepared therefrom.

BACKGROUND ART

At present, halogen-containing flame retardants (especially brominated flame retardants) are widely used in high-molecular flame retardant materials and have better flame retardant effect. However, it is concluded after in-depth study on fire scenes that, although halogen-containing flame retardants have better flame retardant effect and less additional amount, high-molecular materials using halogen-containing flame retardants will produce a large amount of toxic and corrosive gases and smokes and likely make people suffocate, resulting in more serious harm than the fire itself (Waste Electrical and Electronic Equipment Directive and the Restriction of Directive on the Use of Certain Hazardous Substances in Electrical and Electronic Equipment were implemented by European Union in Jul. 1, 2006.) The development of halogen-free flame retardant printed wiring boards has become a key point of the industry development, and many manufacturers of copper clad laminates have launched their own halogen-free flame retardant copper clad laminates.

In the current industry, phosphorus-containing resins are commonly used to achieve flame retardant effect. However, the introduction of too much phosphorus will increase the water absorption of the substrates and worsen the chemical resistance. In recent years, the development of the use of benzoxazine as the matrix resin in halogen-free substrates has received more and more attention. Benzoxazine is a benzo hexaheterocyclic system consisting of oxygen atoms and nitrogen atoms, and has the feature of ring-opening polymerization. When being polymerized, there is no release of small molecules. After polymerization, a reticular structure similar to phenolic resin is formed. The products have a small solidification shrinkage, a low porosity, better mechanical, electrical and flame retardant properties.

On the other aspect, electronic products develop in the direction of lightness, thinness, shortness, high density, security, and high function with the rapid development of electronic industry, which requires that electronic elements shall have higher signal transmission rate and efficiency, and puts higher performance demands on the printed circuit boards as carriers. Information processing of electronic products is developed in the direction of high speed and multi-function; the application frequency increases continuously, and frequencies higher than 3 GHz will gradually become the mainstream. Besides higher demands on heat resistance to laminate materials, the demands on dielectric constant and dielectric loss value become lower.

The current conventional FR-4 is difficult to meet the use demand on high frequency and high-speed development of electronic products. Meanwhile, the substrate materials, together with electronic components, become one important route for PCB and terminal manufacturers and designers to improve the product performances, rather than play the mechanical support role of traditional sense. High dielectric constant (Dk) will slow down the signal transmission rate, and high dielectric loss (Df) will convert partial signal into heat, resulting in loss in the substrate materials. Thus, the development of high-frequency transmission having a low dielectric constant and a low dielectric loss, especially halogen-free high-frequency substrates has become a key point in the industry of copper clad laminates.

In order to solve the aforesaid problems, CN101684191B discloses a condensate having a lower dielectric constant and dielectric loss obtained by curing epoxy resin with combined benzoxazine, styrene-maleic anhydride and phosphorus-containing curing agents. However, there will unavoidably be many other problems by reducing the dielectric performances of the materials only with styrene-maleic anhydride, especially the effect on cohesiveness since non-polar styrene structural unit in styrene-maleic anhydride (SMA) reduces the polarity of the modified matrix resin and weakens the interaction between the resin and the copper foil. Meanwhile, a large amount of benzene ring structures in SMA increase the brittleness of resin crosslinking network, and produce adverse effect on the bonding property under dynamic conditions, so as to reduce the bonding strength between the substrates and between the substrates and copper foils.

CN100523081C discloses a condensate having a lower dielectric constant and dielectric loss obtained by curing phosphorus-containing, halogen-free and phosphorus-free epoxy resin with combined benzoxazine, styrene-maleic anhydride and other curing agents. Though phosphorus-containing epoxy resin as the main resin may achieve excellent flame retardancy, too much introduction of phosphorus will have a great effect on the water absorption of the substrates, which will necessarily have adverse effects on many other performances of the substrates.

CN103131131A discloses a condensate having a lower dielectric constant and dielectric loss obtained by curing epoxy resin with combined benzoxazine, styrene-maleic anhydride and amine curing agents. Although common benzoxazine may achieve the object of curing epoxy resin and flame retardant, it is difficult to meet the high-frequency high-speed transmission since it has a higher dielectric constant. Though the introduction of the amine curing agent may improve the cohesiveness, its defects of great hydroscopicity and insufficient heat resistance for curing epoxy resin will necessarily have adverse effects on the use in high multilayer circuit boards.

Thus, it is a problem needed to be solved at present how to produce a prepreg and a laminate having a low dielectric constant, a low dielectric loss, and at the same time ensuring excellent chemical resistance.

DISCLOSURE OF THE INVENTION

The object of the present invention lies in providing a resin composition, especially a halogen-free resin composition, as well as a prepreg, a laminate and a printed circuit board prepared therefrom.

In order to achieve such object, the present invention discloses the following technical solution.

On the first aspect, the present invention provides a halogen-free resin composition comprising the following components in parts by weight: from 50 to 100 parts of an epoxy resin, from 20 to 70 parts of benzoxazine, from 5 to 40 parts of a polyphenyl ether, from 5 to 40 parts of allylbenzene-maleic anhydride, from 10 to 60 parts of a halogen-free flame retardant, from 0.2 to 5 parts of a curing accelerator, and from 20 to 100 parts of a filler.

The allylbenzene-maleic anhydride of the present invention has the following chemical structural formula:

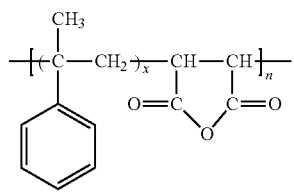

wherein x is any one selected from the group consisting of 1-4, 6 and 8; n is any one selected from the group consisting of 1-12; both x and n are integers.

The allylbenzene-maleic anhydride of the present invention is in an amount of from 5 to 40 parts, e.g. 5, 10, 15, 17, 20, 22, 25, 30, 35, 40 parts, preferably from 15 to 22 parts, further preferably 15 parts.

Allylbenzene-maleic anhydride and benzoxazine are used together in the present invention to cure the epoxy resin, which makes the substrate not only have a low dielectric constant and dielectric loss, but also increase the steric hindrance, hindrance of rotation inside the molecular chains and rigidity of molecular chains of polymers due to the existence of methyl group in allylbenzene-maleic anhydride, so as to increase the heat resistance of the substrate and, at the same time, notably improve the moisture resistance of the substrate due to the hydrophobicity of methyl group.

The epoxy resin of the present invention is any one selected from the group consisting of bisphenol-A epoxy resin, bisphenol-F epoxy resin, biphenyl epoxy resin, alkyl novolac epoxy resin, dicyclopentadiene epoxy resin, bisphenol-A novolac epoxy resin, o-cresol novolac epoxy resin, phenol novolac epoxy resin, trifunctional epoxy resin, tetrafunctional epoxy resin, isocyanate-modified epoxy resin, naphthalene epoxy resin and phosphorus-containing epoxy resin, or a mixture of at least two selected therefrom.

The epoxy resin of the present invention is in an amount of from 50 to 100 parts, e.g. 50, 55, 60, 65, 70, 75, 80, 85, 90, 95, 100 parts, preferably 60 parts.

The benzoxazine of the present invention is any one selected from the group consisting of fluorinated benzoxazine resin, aliphatic benzoxazine resin and dicyclopentadiene benzoxazine resin, or a mixture of at least two selected therefrom.

Preferably, the benzoxazine is any one selected from the group consisting of fluorinated benzoxazine resin and aliphatic benzoxazine resin, or a mixture of at least two selected therefrom.

The fluorinated benzoxazine resin of the present invention is any one selected from the group consisting of the following chemical structural formulae, or a mixture of at least two selected therefrom:

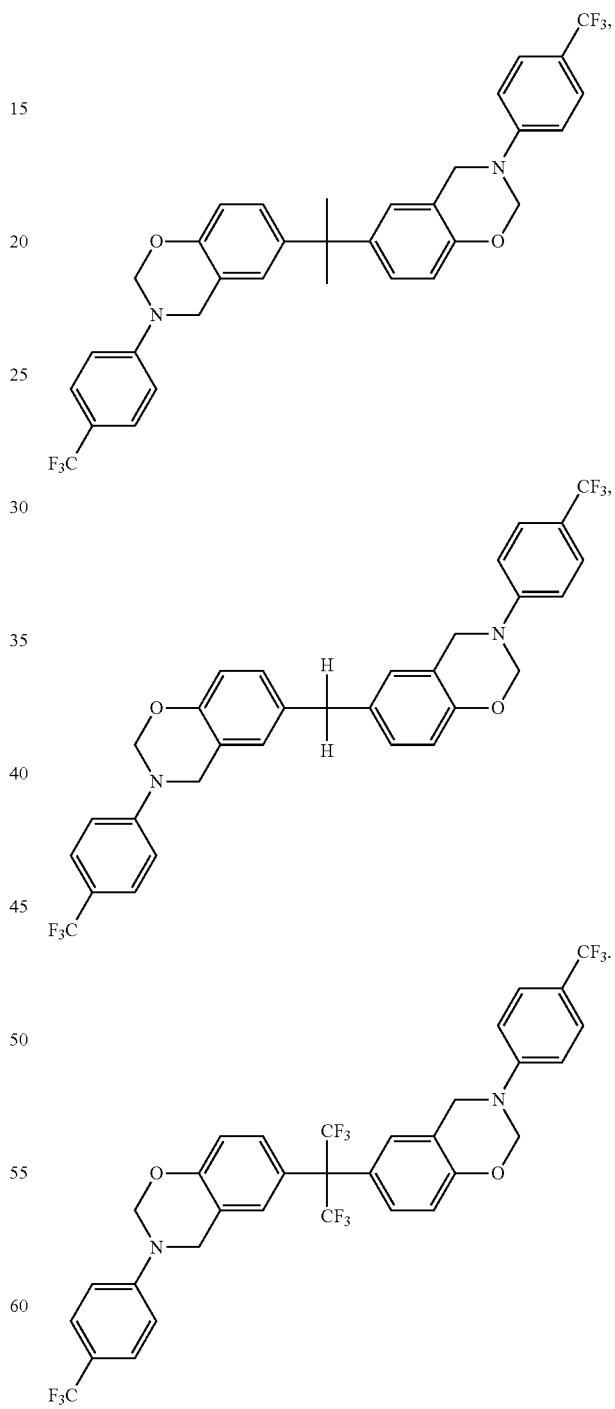

The aliphatic benzoxazine resin of the present invention has the following chemical structural formula:

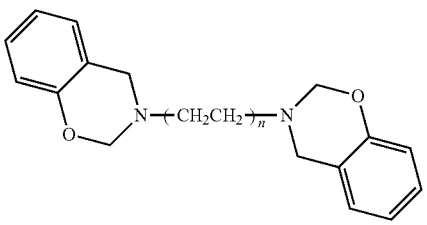

wherein n is 2 or 3.

The dicyclopentadiene benzoxazine resin of the present invention has the following chemical structural formula:

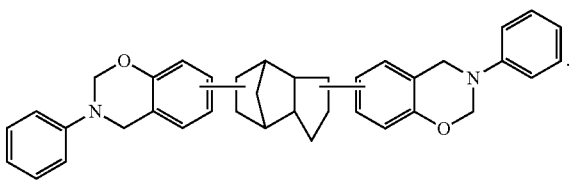

The benzoxazine of the present invention is in an amount of from 20 to 70 parts, e.g. 20, 25, 30, 35, 40, 45, 50, 55, 60, 65, 70 parts, preferably from 40 to 50 parts, further preferably 40 parts.

The polyphenyl ether of the present invention is a polyphenyl ether having a low molecular weight, and has a number average molecular weight of from 1000 to 4000.

The polyphenyl ether of the present invention is in an amount of from 5 to 40 parts, e.g. 5, 10, 15, 20, 25, 30, 35, 40 parts, preferably 20 parts.

The halogen-free flame retardant of the present invention is any one selected form the group consisting of phosphazene, ammonium polyphosphate, tris(2-carboxyethyl)phosphine, tri(isopropylchloro)phosphate, trimethyl phosphate, dimethyl-methyl phosphate, resorcinol bis-xylyl phosphate, phosphorus-nitrogen compounds, melamine polyphosphate, melamine cyanurate, tri-hydroxyethyl isocyanurate, 9,10-dihydro-9-oxa-10-phosphaphenanthrene-10-oxide and DOPO-containing novolac resin, or a mixture of at least two selected therefrom.

The halogen-free flame retardant of the present invention is in an amount of from 10 to 60 parts, e.g. 10, 15, 20, 22, 25, 30, 40, 50, 60 parts, preferably from 20 to 22 parts, further preferably 20 parts.

The present invention discloses using benzoxazine having a low dielectric constant and having flame retardant effect as the main curing agent, adding a small amount of phosphorus-containing flame retardant, to achieve the synergistic flame retardant effect of phosphorus and nitrogen and to improve the flame retardancy of the substrate while greatly reducing the phosphorus amount and make the substrate have better moisture resistance.

The curing accelerator of the present invention is imidazole accelerator, and the accelerator is any one selected from the group consisting of 2-methylimidazole, undecylimidazole, 2-ethyl-4-methyimidazole, 2-phenylimidazole and 1-cyanoethyl-substituted imidazole, or a mixture of at least two selected therefrom.

The curing accelerator of the present invention is in an amount of from 0.2 to 5 parts, e.g. 0.2, 0.5, 1, 2, 3, 4, 5 parts.

The filler of the present invention is an organic or inorganic filler. When being an inorganic filler, the filler is any one selected from the group consisting of aluminum hydroxide, alumina, magnesium hydroxide, magnesium oxide, aluminum oxide, silica, calcium carbonate, aluminum nitride, boron nitride, silicon carbide, titanium dioxide, zinc oxide, zirconium oxide, mica, boehmite, calcined talc, talcum powder, silicon nitride and calcined kaolin, or a mixture of at least two selected therefrom. When being an organic filler, the filler is any one selected from the group consisting of polytetrafluoroethylene powder, polyphenylene sulfide and polyether sulfone powder, or a mixture of at least two selected therefrom.

The silica of the present invention may be crystalline-type, molten-type or spherical silica.

The filler of the present invention has a particle size of from 0.01 to 50 μm, 0.01 μm, e.g. 0.05 μm, 1 μm, 5 μm, 10 μm, 15 μm, 20 μm, 25 μm, 30 μm, 40 μm, 50 μm, preferably from 1 to 15 μm.

The filler of the present invention is in an amount of from 20 to 100 parts, e.g. 20, 30, 40, 50, 60, 70, 80, 90, 100 parts, preferably 50 parts.

In order to homogeneously disperse the filler in the resin composition of the present invention, a dispersant may be added which is selected from the group consisting of amino silane coupling agent and epoxy silane coupling agent, to improve the binding property of inorganic and woven glass cloth so as to achieve homogeneous dispersion. Moreover, these kinds of coupling agents are free of heavy metals and have no adverse effect on human bodies. The amount thereof is in an amount of from 0.5 to 2 wt. % of the filler. If the amount thereof is too high, the reaction will be speeded up to affect the storage time; if the amount thereof is too low, there is no notable effect on improving the binding stability.

On the second aspect, the present invention further provides a prepreg prepared from the halogen-free resin composition according to the first aspect of the present invention, wherein the prepreg comprises a matrix material, and the halogen-free resin composition attached thereon after impregnation and drying.

The matrix material of the present invention is a nonwoven or woven glass fiber cloth.

On the third aspect, the present invention further provides a laminate comprising the prepreg according to the second aspect of the present invention.

On the fourth aspect, the present invention further provides a printed circuit board comprising the laminate according to the third aspect of the present invention.

As compared to the prior art, the present invention has the following beneficial effects.

The laminates prepared from the halogen-free resin composition of the present invention have a dielectric constant controlled to be 3.7 or less, and a maximum dielectric loss value of only 0.0060, and a PCT water absorption of 0.34-0.36, and achieve the V-0 standard in the flame retardancy test. While ensuring being halogen-free and the flame retardancy, the laminates have overall performances, such as a low dielectric constant, a low dielectric loss, an excellent flame retardancy, heat resistance, cohesiveness, moisture resistance and the like, and are suitable for use in halogen-free high multilayer circuit boards.

EMBODIMENTS

The technical solution of the present invention is further stated by the following specific embodiments.

Those skilled in the art shall know that said examples are used to better understand the present invention, rather than any specific restriction to the present invention.

PREPARATION EXAMPLE—SYNTHESIS OF BENZENE PROPYLENE-MALEIC ANHYDRIDE

Under nitrogen protection and stirring conditions, maleic anhydride monomer and an initiator were added in a medium and dissolved. When being heated to 60-80° C., benzene propylene and a molecular weight modifier were dripped. The stirring continued for 1-8 h after dripping, to obtain a dispersion system of benzene propylene/maleic anhydride polymer particles having a low molecular weight. The dispersion system was centrifuged and dried to obtain a benzene propylene/maleic anhydride alternating copolymer having a low molecular weight. The initiator therein was organic peroxides or azo compounds; the medium was a mixed solution of organic acid alkyl ester and alkane; the molecular weight modifier was vinyl acetate; maleic anhydride and benzene propylene were in a molar ratio of 1:0.90-0.96; the mass concentration sum of maleic anhydride monomer and benzene propylene monomer in the reaction system were 2.0-7.5%; the initiator had a mass concentration of 0.05-0.35%; the molecular weight modifier had a mass concentration of 0.10-0.45%; the organic acid alkyl ester in the mixed solution of organic acid alkyl ester and alkane had a volume percent of 20-80%.

Benzene propylene-maleic anhydride having the following structural formula is obtained:

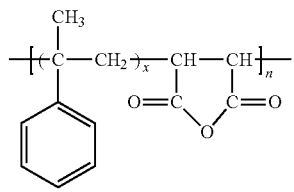

wherein x is any one selected from the group consisting of 1-4, 6 and 8; n is any one selected from the group consisting of 1-12; both x and n are integers.

EXAMPLES

Preparation Method for Copper Clad Laminates

Epoxy resin, benzoxazine, a polyphenyl ether, benzene propylene-maleic anhydride, a halogen-free flame retardant, a curing accelerator, a filler and a solvent were placed in a vessel, stirred and homogeneously mixed to obtain a glue. The solvent was used to adjust the solid content of the solution to 60-70% to obtain a varnish, i.e. the halogen-free composition varnish of the present invention. A 2116 electronic level glass fiber cloth was impregnated with the varnish, oven-dried to obtain a prepreg. Six sheets of 2116 prepregs were covered with electrolytic copper foils having a thickness of 35 μm on both sides thereof, vacuum-laminated in a hot press, cured at 190° C. for 120 minutes to obtain copper clad laminates.

The components and contents thereof (in parts by weight) in Examples 1-8 and Comparison Examples 1-5 are shown in Table 1, and the component codes and corresponding component names are shown as follows.

A—Epoxy resin
A-1—biphenyl epoxy resin: NC-3000-H (Product name from Nippon Kayaku)
A-2—dicyclopentadiene epoxy resin: HP-7200H (Product name from Dainippon Ink)
B—benzoxazine
B-1—aliphatic benzoxazine: KAH-F5404 (Product name from Kolon)
B-2—fluorinated benzoxazine: KAH-F5301 (Product name from Kolon)
B-3—bispheno-F benzoxazine: LZ8280 (Huntsman Advanced Materials)
B-4—dicyclopentadiene benzoxazine: LZ8260 (Huntsman Advanced Materials)
C-1—polyphenyl ether having a low molecular weight: MX90 (Product name from SABIC Innovative Plastics) having a number average molecular weight of 1000-4000
C-2—polyphenyl ether having a high molecular weight: Sabic640-111 (Product name from SABIC Innovative Plastics) having a number average molecular weight of 15000-20000
D-1—Benzene propylene-maleic anhydride oligomer in the preparation example
D-2—Styrene-maleic anhydride oligomer: SMA-EF40 (Product name from Sartomer)
E—Halogen-free flame retardant: phosphorus-containing novolac resin: XZ92741 (Product name from DOW Chemical)
F—Curing accelerator: 2E4MZ (Product name from Shikoku Chemicals)
G—Filler: molten silica The processes for preparing copper clad laminates in Examples 1-8 and Comparison Examples 1-5 is the same as that in the examples.

The following methods are used to test the glass transition temperature (Tg), peeling strength (PS), dielectric constant (Dk) and dielectric loss tangent (Df), flame retardancy, dip soldering resistance and water absorption after PCT for 2 hours, and the test results are shown in Table 2.

The performance parameters are tested by the following methods.

A—Glass transition temperature (Tg): tested by the differential scanning calorimetry (DSC) according to the DSC method stipulated under IPC-TM-650 2.4.25;

B—Peeling strength (PS): testing the peeling strength of the metal cover layer according to the test conditions of "after heat stress" in the method of IPC-TM-650 2.4.8;

C—Dielectric constant (Dk) and dielectric loss tangent (Df): testing the dielectric constant (Dk) and dielectric loss tangent (Df) at 1 GHz by the resonance method of strip lines according to IPC-TM-650 2.5.5.5;

D—Flame retardancy: tested according to UL-94 standard; and

E—Dip soldering resistance and water absorption after PCT for 2 hours.

Copper clad laminates were impregnated in the copper etching solution to remove the copper foils on the surface and to evaluate the substrates; the substrates were placed in a pressure pan at 121° C. and 2 atm for 2 hours, and impregnated in a tin stove having a temperature of 288° C. after testing the water absorption; when blistering or splitting takes place in the substrate, the corresponding time was recorded. When blistering or splitting does not take place more than 5 minutes after the substrates were placed in the tin stove, the evaluation was ended.

TABLE 1

| | Example 1 | Example 2 | Example 3 | Example 4 | Example 5 | Example 6 | Example 7 | Example 8 | Comp. Example 1 | Comp. Example 2 | Comp. Example 3 | Comp. Example 4 | Comp. Example 5 |
|---|---|---|---|---|---|---|---|---|---|---|---|---|---|
| A-1 | | | 60 | 60 | 60 | | 50 | 50 | 60 | 60 | 60 | | |
| A-2 | 60 | | | | | 60 | 50 | 50 | | | | 60 | 60 |
| B-1 | 42 | 42 | 42 | 42 | | | | 70 | 42 | 42 | | | |
| B-2 | | | | | 42 | 20 | | | | | | 42 | 42 |
| B-3 | | | | | | | | | | | 42 | | |
| B-4 | | | | | | | 70 | | | | | | |
| C-1 | 25 | 25 | 25 | 25 | 25 | 5 | 40 | 40 | 25 | 25 | 25 | | |
| C-2 | | | | | | | | | | | | | 25 |
| D-1 | 5 | 15 | 25 | 40 | 25 | 10 | 40 | 40 | | | 25 | 25 | 25 |
| D-2 | | | | | | | | | 15 | 25 | | | |
| E | 20 | 20 | 20 | 20 | 20 | 10 | 60 | 60 | 20 | 20 | 20 | 20 | 20 |
| F | q.s. | q.s. | q.s. | q.s. | q.s. | q.s. | q.s. | q.s. | q.s. | q.s. | q.s. | q.s. | q.s. |
| G | 50 | 50 | 50 | 50 | 50 | 20 | 100 | 100 | 50 | 50 | 50 | 50 | 50 |

TABLE 2

| Testing items | Example 1 | Example 2 | Example 3 | Example 4 | Example 5 | Example 6 | Example 7 |
|---|---|---|---|---|---|---|---|
| Tg (DSC) (° C.) | 185 | 186 | 190 | 197 | 189 | 184 | 195 |
| Peeling strength (N/mm) | 1.35 | 1.35 | 1.34 | 1.30 | 1.32 | 1.34 | 1.34 |
| Dielectric constant (1 GHz) | 3.7 | 3.7 | 3.6 | 3.6 | 3.7 | 3.7 | 3.7 |
| Dielectric loss (1 GHz) | 0.0060 | 0.0059 | 0.0055 | 0.0053 | 0.0060 | 0.0060 | 0.0060 |
| Combustibility | V-0 | V-0 | V-0 | V-0 | V-0 | V-0 | V-0 |
| PCT (min) | >5 | >5 | >5 | >5 | >5 | >5 | >5 |
| PCT water absorption | 0.34 | 0.34 | 0.35 | 0.36 | 0.35 | 0.34 | 0.33 |
| Processability | Good | Good | Good | Good | Good | Good | Good |

| Testing items | Example 8 | Comp. Example 1 | Comp. Example 2 | Comp. Example 3 | Comp. Example 4 | Comp. Example 5 |
|---|---|---|---|---|---|---|
| Tg (DSC) (° C.) | 198 | 175 | 185 | 186 | 192 | 187 |
| Peeling strength (N/mm) | 1.35 | 1.35 | 1.33 | 1.32 | 1.45 | 1.30 |
| Dielectric constant (1 GHz) | 3.6 | 3.8 | 3.7 | 4.0 | 4.1 | 3.8 |
| Dielectric loss (1 GHz) | 0.0054 | 0.0068 | 0.0065 | 0.0086 | 0.010 | 0.0061 |
| Combustibility | V-0 | V-0 | V-0 | V-1 | V-0 | V-0 |
| PCT (min) | >5 | >5 | >5 | >5 | >5 | >5 |
| PCT water absorption | 0.34 | 0.36 | 0.38 | 0.40 | 0.39 | 0.35 |
| Processability | Good | Good | Good | Good | Good | Worse |

According to Tables 1 and 2, (1) by comparing Examples 2-3 to Comparison Examples 1-2, it can be seen that the laminates in Examples 2-3 have a lower dielectric constant, dielectric loss and PCT water absorption than those in Comparison Examples 1-2, which shows that using benzene propylene-maleic anhydride in Examples 2-3 can achieve a lower dielectric constant, dielectric loss and PCT water absorption than using styrene-maleic anhydride in Comparison Example 1.

(2) By comparing Examples 3 and 5 to Comparison Example 3, it can be seen that the laminates in Examples 3 and 5 have a higher glass transition temperature, but a lower dielectric constant, dielectric loss and PCT water absorption than that in Comparison Example 3, and a flame retardancy of V-0 level, which shows that using aliphatic benzoxazine and fluorinated benzoxazine respectively in Examples 3 and 5 can achieve a higher glass transition temperature, but a lower dielectric constant, dielectric loss and PCT water absorption, and a higher flame retardancy than using bisphenol-F benzoxazine in Comparison Example 3. According to Examples 7 and 8, it can be seen that using dicyclopentadiene benzoxazine and aliphatic benzoxazine both can achieve a higher glass transition temperature, but a lower dielectric constant, wherein using aliphatic benzoxazine can achieve a higher glass transition temperature, but a lower dielectric constant.

(3) By comparing Example 5 to Comparison Example 4, it can be seen that the laminate in Example 5 has a lower dielectric constant, dielectric loss and PCT water absorption than that in Comparison Example 4, which shows that using polyphenyl ether resin having a low molecular weight in Example 5 can achieve a lower dielectric constant, dielectric loss and PCT water absorption than using no component above in Comparison Example 4. By comparing Example 5 to Comparison Example 5, it can be seen that using polyphenyl ether resin having a high molecular weight results in a worse processability, though their overall performances are quite equivalent to each other.

(4) By comparing Examples 1-4, it can be seen that Example 1 shows a lowest glass transition temperature, but a highest dielectric constant and dielectric loss, and Example 4 shows a highest glass transition temperature, but a lowest dielectric constant and dielectric loss, which shows that the increase of the benzene propylene-maleic anhydride content may increase the glass transition temperature and reduce the dielectric constant and dielectric loss.

According to Examples 1-8, it can be seen that the laminates prepared by using the halogen-free resin composition of the present invention have a dielectric constant which may be controlled at 3.7 or less, a maximum dielectric loss value of just 0.0060, and a PCT water absorption of 0.34-0.36, and may achieve the V-0 standard in the flame retardancy test UL-94. Therefore, while ensuring being halogen-free and the flame retardancy, the laminates have overall performances, such as a low dielectric constant, a low dielectric loss, an excellent flame retardancy, heat resistance, cohesiveness, moisture resistance and the like, and are suitable for use in halogen-free high multilayer circuit boards.

The aforesaid examples are only better examples of the present invention, rather than for limiting the protection scope of the present invention. Thus, equivalent changes or modifications made according to the principles as stated within the protection scope of the present invention application all fall within the protection scope of the present invention application.

The invention claimed is:

1. A halogen-free resin composition, comprising in parts by weight: from 50 to 100 parts of an epoxy resin, from 20 to 70 parts of benzoxazine, from 5 to 40 parts of a polyphenyl ether, from 5 to 40 parts of allylbenzene-maleic anhydride, from 10 to 60 parts of a halogen-free flame retardant, from 0.2 to 5 parts of a curing accelerator, and from 20 to 100 parts of a filler;

wherein the allylbenzene-maleic anhydride has the following chemical structural formula

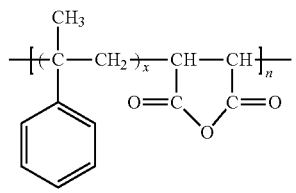

wherein x is any one selected from the group consisting of 1-4, 6 and 8; n is any one selected from the group consisting of 1-12; both x and n are integers.

2. The halogen-free resin composition according to claim 1, wherein the epoxy resin is any one selected from the group consisting of bisphenol-A epoxy resin, bisphenol-F epoxy resin, biphenyl epoxy resin, alkyl novolac epoxy resin, dicyclopentadiene epoxy resin, bisphenol-A novolac epoxy resin, o-cresol novolac epoxy resin, phenol novolac epoxy resin, trifunctional epoxy resin, tetrafunctional epoxy resin, isocyanate-modified epoxy resin, naphthalene epoxy resin and phosphorus-containing epoxy resin, or a mixture of at least two selected therefrom.

3. The halogen-free resin composition according to claim 1, wherein the benzoxazine is any one selected from the group consisting of fluorinated benzoxazine resin, aliphatic benzoxazine resin and dicyclopentadiene benzoxazine resin, or a mixture of at least two selected therefrom.

4. The halogen-free resin composition according to claim 3, wherein the fluorinated benzoxazine resin is any one selected from the group consisting of the following chemical structural formulae, or a mixture of at least two selected therefrom

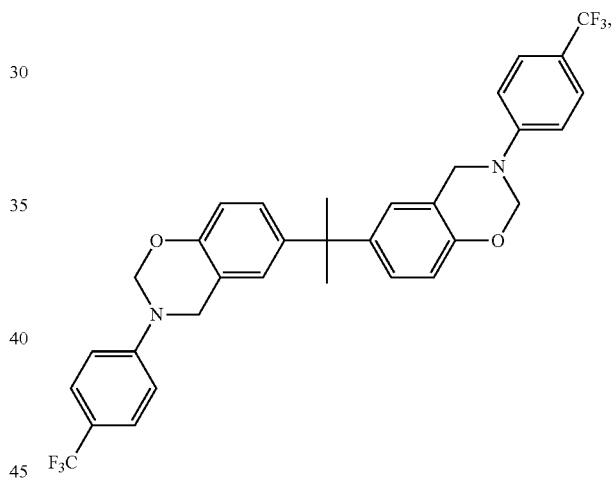

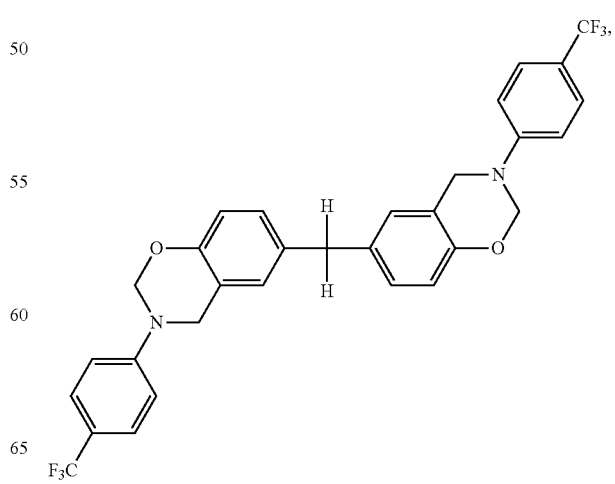

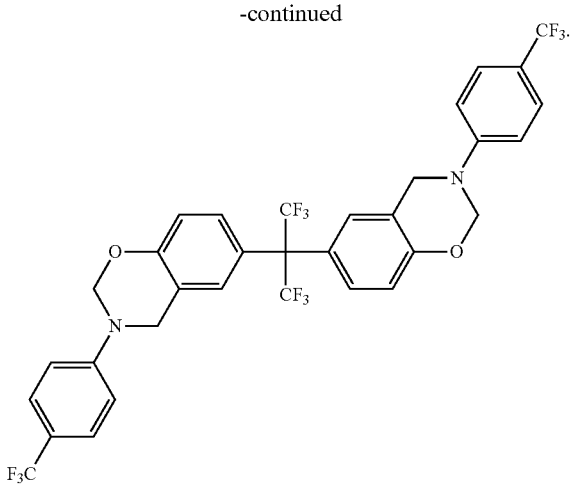

5. The halogen-free resin composition according to claim 3, wherein the aliphatic benzoxazine resin has the following chemical structural formula:

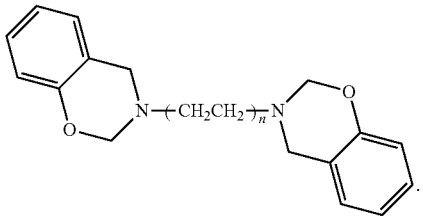

wherein n is 2 or 3.

6. The halogen-free resin composition according to claim 3, wherein the dicyclopentadiene benzoxazine resin has the following chemical structural formula:

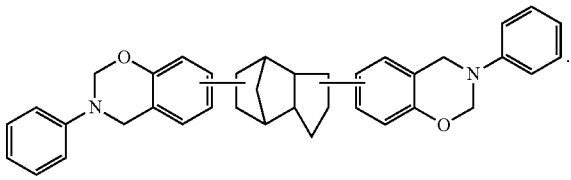

7. The halogen-free resin composition according to claim 1, wherein the polyphenyl ether has a number average molecular weight of 1000-4000.

8. The halogen-free resin composition according to claim 1, wherein the halogen-free flame retardant is any one selected form the group consisting of phosphazene, ammonium polyphosphate, tris(2-carboxyethyl)phosphine, tri(isopropylchloro)phosphate, trimethyl phosphate, dimethylmethyl phosphate, resorcinol bis-xylyl phosphate, phosphorus-nitrogen compounds, melamine polyphosphate, melamine cyanurate, tri-hydroxyethyl isocyanurate, 9,10-dihydro-9-oxa-10-phosphaphenanthrene-10-oxide and DOPO-containing novolac resin, or a mixture of at least two selected therefrom.

9. The halogen-free resin composition according to claim 1, wherein the curing accelerator is imidazole accelerator.

10. The halogen-free resin composition according to claim 9, wherein the curing accelerator is any one selected from the group consisting of 2-methylimidazole, undecylimidazole, 2-ethyl-4-methylimidazole, 2-phenylimidazole and 1-cyanoethyl-substituted imidazole, or a mixture of at least two selected therefrom.

11. The halogen-free resin composition according to claim 1, wherein the filler is an organic or inorganic filler.

12. The halogen-free resin composition according to claim 11, wherein the filler is an inorganic filler selected from the group consisting of aluminum hydroxide, alumina, magnesium hydroxide, magnesium oxide, aluminum oxide, silica, calcium carbonate, aluminum nitride, boron nitride, silicon carbide, titanium dioxide, zinc oxide, zirconium oxide, mica, boehmite, calcined talc, talcum powder, silicon nitride and calcined kaolin, or a mixture of at least two selected therefrom.

13. The halogen-free resin composition according to claim 11, wherein the filler is an organic filler selected from the group consisting of polytetrafluoroethylene powder, polyphenylene sulfide and polyether sulfone powder, or a mixture of at least two selected therefrom.

14. The halogen-free resin composition according to claim 11, wherein the filler has a particle size of from 0.01 to 50 µm.

15. A prepreg prepared from the halogen-free resin composition according to claim 1, wherein the prepreg comprises a matrix material, and the halogen-free resin composition attached thereon after impregnation and drying.

16. A laminate, comprising the prepreg according to claim 15.

17. A printed circuit board, comprising the laminate according to claim 16.

18. The prepreg according to claim 15, wherein the matrix material is a non-woven or woven glass fiber cloth.

19. The halogen-free resin composition according to claim 1, wherein the benzoxazine is any one selected from the group consisting of fluorinated benzoxazine resin and aliphatic benzoxazine resin, or a mixture of at least two selected therefrom.

* * * * *